United States Patent [19]

Skerlos et al.

[11] 4,173,737
[45] Nov. 6, 1979

[54] LIMITED POSITION, NON-VOLATILE MEMORY TUNING SYSTEM

[75] Inventors: Peter C. Skerlos, Arlington Heights; Richard A. Smirl, Chicago, both of Ill.

[73] Assignee: Zenith Radio Corporation, Glenview, Ill.

[21] Appl. No.: 903,645

[22] Filed: May 4, 1978

[51] Int. Cl.² ............................................. H04B 1/26
[52] U.S. Cl. .................................... 325/418; 325/459; 325/464
[58] Field of Search ............................... 325/420–422, 325/453, 459, 464, 468; 358/191, 195; 334/11, 14, 15

[56] References Cited

U.S. PATENT DOCUMENTS

| 3,715,687 | 2/1973 | Solender | 325/453 |
| 3,810,022 | 5/1974 | Collins | 325/464 |

Primary Examiner—Marc E. Bookbinder

[57] ABSTRACT

A limited-position television tuning system includes a read-only memory (ROM) dedicated to VHF channel coarse tuning information. UHF coarse tuning information and VHF/UHF fine tuning information are contained in an electrically alterable ROM (EAROM). Equalization information for equalizing both fine tuning information and automatic frequency control (AFC) information for VHF is contained in another ROM. The memories are addressed by a viewer-operated switch. Information is read out as pulse-width modulated (PWM) signals by counter-interrogated comparators. A hybrid scaling circuit includes a pair of operational amplifiers (Op Amps) and three transistors, with each PWM signal being applied to a separate transistor. The fine tune transistor, along with the receiver AFC signal, drives the first Op Amp which, in turn, supplies operating potential to the equalization transistor, the output of which is coupled to the input of the second Op Amp. The output of the coarse tuning information transistor also drives an input of the second Op Amp, the output of which is used to develop the tuning voltage.

10 Claims, 7 Drawing Figures

LIMITED POSITION, NON-VOLATILE MEMORY TUNING SYSTEM

RELATED APPLICATIONS

The subject matter of the present application is related to, but independent of, subject matter disclosed and claimed in application Ser. No. 791,897, filed Apr. 28, 1977 now U.S. Pat. No. 4,142,157 in the name of Akio Tanaka and assigned to Zenith Radio Corporation.

BACKGROUND OF THE INVENTION

The related application mentioned above discloses a television tuning system in which coarse tuning information, fine tuning information and equalization information for selected television channels are stored in appropriate memories. The equalization information is determined from the tuning voltage-versus-frequency characteristic of the tuner and represents the slope of the tuning curve in the vicinity of the frequency corresponding to the selected channel number. The memories are interrogated for each channel change and the respective informations read out and combined to produce a signal from which a tuning voltage may be generated. The application alludes to equilization of an automatic frequency control potential but does not disclose apparatus therefor.

As shown in the prior art (and as described in the above-entitled application) the memories are interrogated by means of a comparator and counter arrangement. One set of comparator inputs is supplied by the memory and the other is supplied by the counter. The counter is clocked until its binary count matches the binary content of the accessed memory location—as determined by the comparator. The output of the comparator is at a first logic level whenever the count of the counter is less than the binary count stored in the accessed memory location and at a second logic level whenever the count of the counter is equal to or greater than the binary content of the memory. In the circuit of the above mentioned copending application the counters are clocked for operation in fixed time intervals and the output of the comparators remain at a 0 logic level for the time it takes to reach the stored binary content. Thus a 0 level pulse is generated, the width of which is directly related to the time required for the counters to attain the stored count, which is a direct indication of the information stored in the memory. The comparator output is thus a PWM signal indicative of the memory content.

While circuits are known in the art for combining pulse-width modulated tuning signals to produce a common tuning voltage output, none combines coarse tuning information with equalized fine tuning information and equalized AFC information for producing a tuning voltage.

OBJECTS OF THE INVENTION

A principal object of the invention is to provide a novel and improved all-channel television tuning system.

A further object of the invention is to provide a simplified limited position, all-channel television tuning system.

SUMMARY OF THE INVENTION

A television receiver includes a voltage controllable tuner, means producing coarse tuning information for a selected group of channels; means producing fine tuning information for said selected group of channels; means producing equalization information for said selected group of channels related to the slope of the tuner voltage-versus-frequency characteristic at said selected channels; means developing AFC information related to actual tuning of said television receiver; means proportioning said fine tuning information and said AFC information with said equalization information; means combining the proportioned fine tuning information and the proportioned AFC information with the coarse tuning information for the selected channel; and means generating a tuning voltage for the tuner.

BRIEF DESCRIPTION OF THE DRAWINGS

The features of the present invention which are believed to be novel are set forth with particularity in the appended claims. The invention, together with further objects and advantages thereof, may best be understood by reference to the following description taken in conjunction with the accompanying drawings, in the several figures of which like reference numerals identify like elements, and in which:

DESCRIPTION OF THE PREFERRED EMBODIMENT

Figure 1:
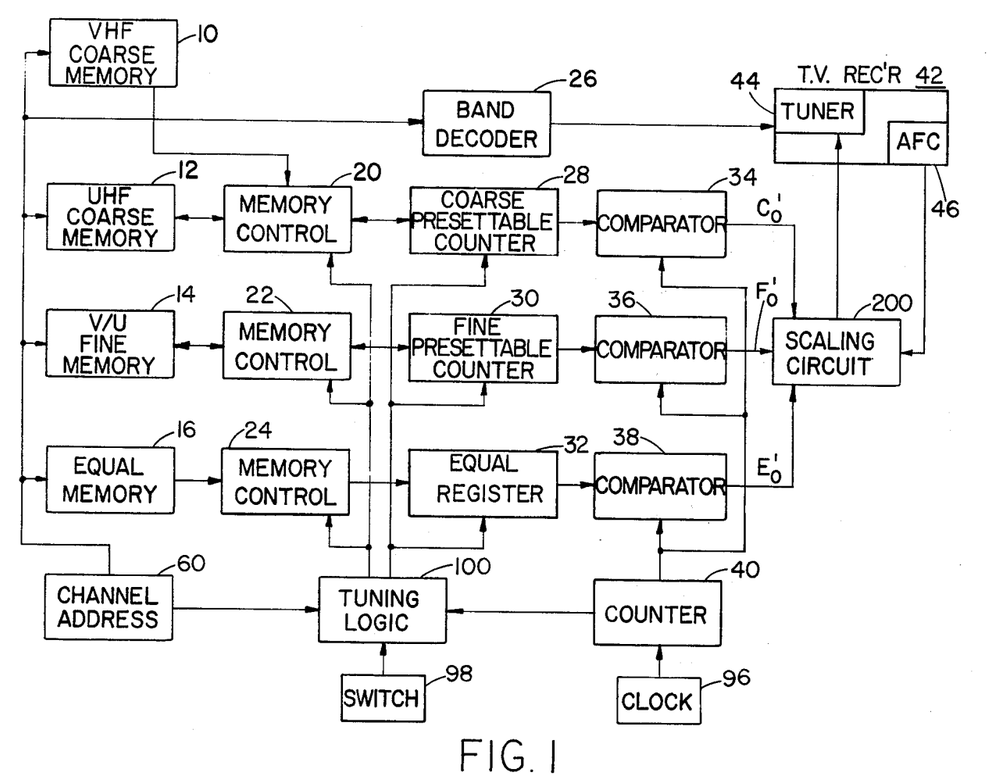
FIG. 1 is a block diagram of a limited tuning position television receiver incorporating the invention.

FIG. 1 is a block diagram of a television tuning system constructed in accordance with the present invention. Blocks 10, 12, 14 and 16 are labeled VHF coarse, UHF coarse, V/U (VHF and UHF) fine and equal, and represent respectively the various memories for retaining system tuning information. The VHF coarse memory and equalization memory are in the form of ROMS, namely, read-only memories that are not alterable. The UHF coarse tuning memory and the V/U fine tuning memory are electrically alterable and are commonly referred to in the art as EAROMS. A channel address 60 accesses the memories and a band decoder 26. The band decoder supplies appropriate potentials to a tuner 44 shown in block form as part of a TV receiver 42. The receiver also includes an AFC circuit 46, also indicated in block form. A coarse tuning memory control 20, a fine tuning memory control 22 and an equilization memory control 24 are accessed by a tuning logic circuit 100. The lines with an arrowhead at each end joining blocks indicate two-way connections between them.

VHF coarse tuning memory 10 and coarse tuning memory control 20 are connected and information transfer is only from the coarse tuning memory. Coarse tuning memory control 20 is interconnected with UHF coarse tuning memory 12 and V/U fine tuning memory 14 is interconnected with fine tuning memory control 22. These memories are alterable whereas equalization memory 16 and VHF coarse tuning memory 10 are not and merely supply information to their respective memory controls 24 and 20. A switch 98 is coupled to tuning logic 100. Two presettable counters 28 and 30 are provided for the coarse tuning information and the fine tuning information respectively, equalization information, respectively. The presettable counters are controlled from tuning logic 100 and perform the dual functions of counters for changing memory information and registers for "reading" memory information. Presettable counter 28 is intercoupled with memory control 20 and presettable counter 30 intercoupled with memory control 22. An equal register 32 is connected to and supplied from equalization memory control 24.

The outputs of the two presettable counters and one register are supplied to corresponding inputs of a group of comparators 34, 36 and 38. The other inputs of the comparators are supplied from a counter 40, which is driven from a clock 96. Counter 40 also supplies timing signals for tuning logic 100. The outputs of the comparators are PWM signals indicative of the information in the memories. The PWM signal from the coarse tuning comparator is labeled $C_o'$, that from the fine tuning comparator $F_o'$ and that from the equalizing comparator $E_o'$. These informations are supplied to a scaling circuit 200, which also receives information from AFC circuit 46, and which provides a tuning voltage for the tuner in the television receiver.

Figure 2A:
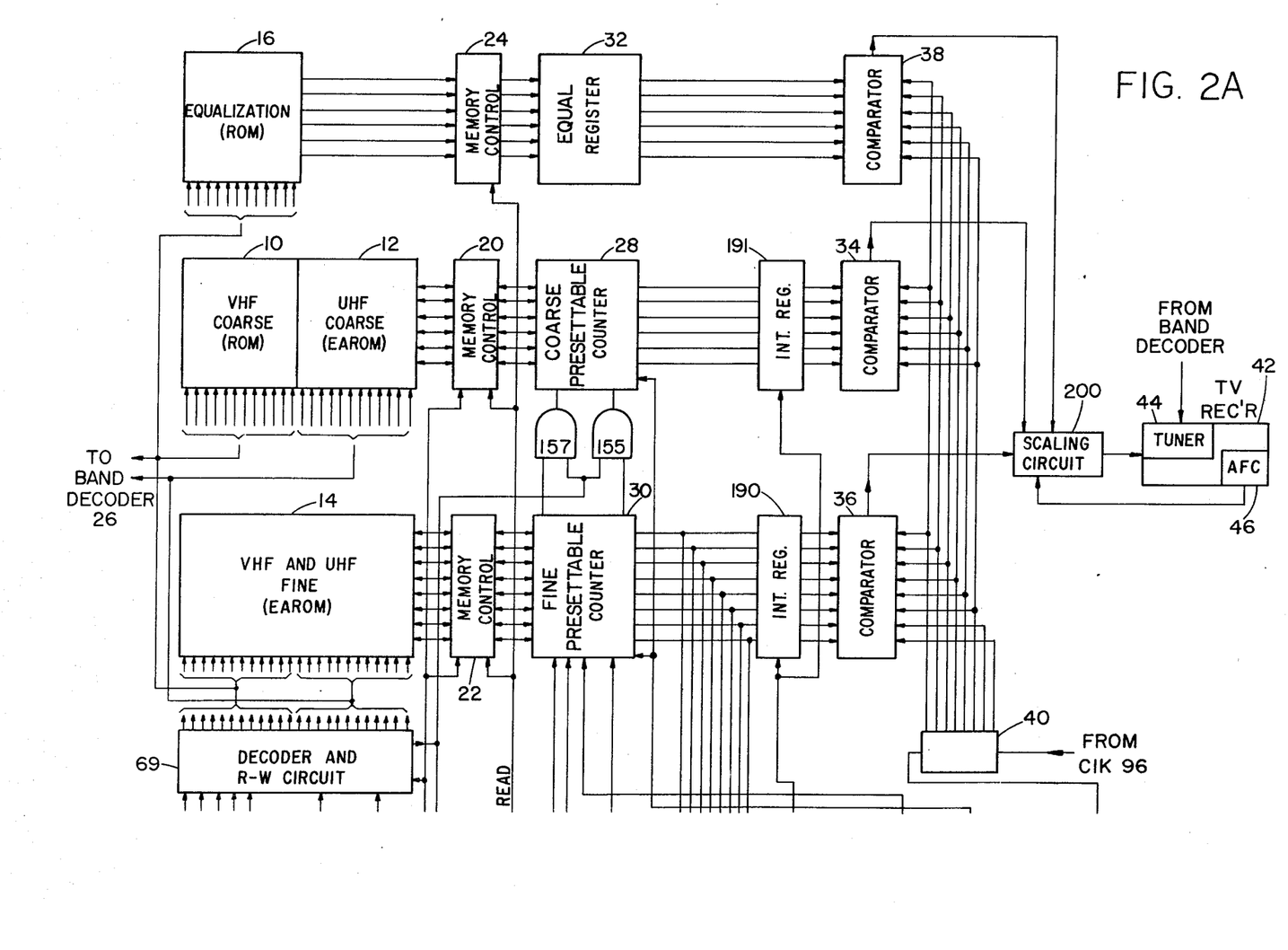
FIGS. 2A and 2B together are a combined block and logic diagram of the essential elements of FIG. 1.
Figure 2B:
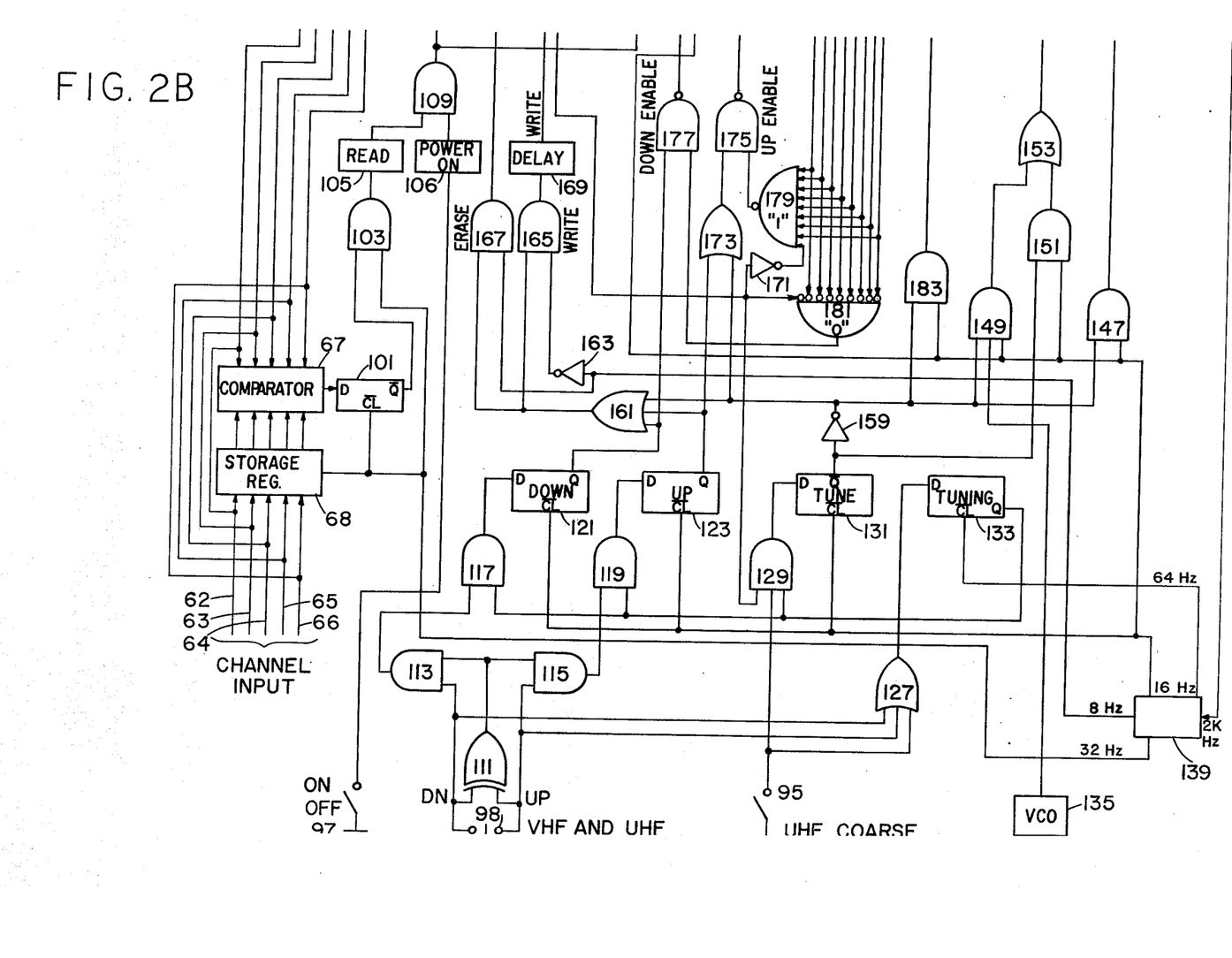

FIGS. 2A and 2B represent an expanded version of the block diagram of FIG. 1 with the tuning logic details disclosed. The figures are to be positioned with FIG. 2A above FIG. 2B with all interconnections between the figures in alignment. Equalization memory ROM 16 and VHF coarse tuning memory ROM 10 are each supplied with a plurality of input leads from a decoder 69. Similarly UHF coarse tuning EAROM 12 and VHF/UHF fine tuning EAROM 14 are supplied with appropriate numbers of input leads. Decoder 69 is well-known in the art and acts to produce outputs which are correlated to coded signals at its input upon occurrence of read, erase or write signals. It is sometimes called a 1/N decoder when N equals the total number of code combinations. In the arrangement shown, decoder 69 has 24 output leads, 12 dedicated to VHF channels and 12 dedicated to UHF channels. The ROM for the VHF channels is not addressed by the UHF decoder leads. While the number of tuning positions is a matter of design choice, the 12 VHF and 12 UHF arrangement is particularly attractive from a manufacturing viewpoint and also provides a sufficient number of UHF positions to satisfy the needs of most geographical locations. Decoder 69 is addressed by five leads 62–66 (from a switch-encoder arrangement) which bear appropriate binary codes for selectively activating the desired decoder output. The outputs of equalization ROM 16 are supplied to memory control 24 which in turn supplies equal register 32.

The detailed connections of the elements comprising tuning logic 100 will now be described. For convenience, elements in tuning logic 100 are all numbered in the 100 series. Logic gates will be described as AND's, NAND's etc., flip-flops referred to as FF's and terminals by their lettered designations, such as D, Q and $\overline{CL}$.

An eight-stage counter 139 is driven at 2 KHz from counter 40 and provides clock pulse outputs of 8 Hz, 16 Hz, 32 Hz and 64 Hz. The 32 Hz clock pulse train is supplied to an input of an AND 103, to the clock terminal of a 5 bit storage register 68 and to the inverted clock terminal ($\overline{CL}$) of a delay flip-flop (FF) 101, the D terminal of which driven by a 5 bit comparator 67. The $\overline{Q}$ output of FF 101 supplies the remaining input of AND 103, the output of which is coupled to a one shot multivibrator 105. The output of multivibrator 105 supplies a negative read pulse to one input of an AND 109. The other input of AND 109 is supplied from the negative going output of a one shot multivibrator 106 which is driven from the on-off switch 97. The read pulse output is supplied to decoder 69 and to the three memory controls 20, 22 and 24.

A fine tune up/down switch 98 has a Down terminal connected to first inputs of an AND 113, an OR 127 and an EXCLUSIVE OR 111. The Up terminal is connected to a first input of an AND 115, a second input of AND 127 and the remaining input of EXCLUSIVE OR 111. The output of EXCLUSIVE OR 111 is connected to the remaining inputs of AND's 113 and 115. The output of AND 113 is connected to an input of an AND 117 and the output of AND 115 is connected to one input of an AND 119. A 64 Hz pulse signal is supplied to $\overline{CL}$ of a timing FF 133, Q of which is connected to one input of an AND 129 and the remaining inputs of AND's 117 and 119.

The output of AND 117 is connected to the D input of a Down FF 121 and the output of AND 119 is connected to the D input of an Up FF 123. A negative going 16 Hz clock output from counter 139 is supplied to the $\overline{CL}$ terminals of FF's 121, 123 and 131; to one input each of AND's 147, 149, 151, 183 and to presettable counter 30. Q of Down FF 121 is connected to a first input of an OR 161 and to a first input of a NAND 177 which provides the Down enable signal for presettable counter 30. Q of Up FF 123 is connected to a second input of OR 161 and to a first input of an OR 173. As will be seen the other input of OR 173 comes from Tune FF 131, through inverter 159, and OR 173 feeds NAND 175 for producing the Up enable signal for presettable counter 30.

A switch 95 for UHF coarse tuning is connected to the last input of OR 127 and to a second input of AND 129. The output of OR 127 supplies the D terminal of timing FF 133. The last input of AND 129 receives a UHF sense signal from decoder 69. The second input of AND 149 is supplied with a variable frequency signal from a voltage controllable oscillator (VCO) 135, indicated in block form. The output of AND 129 is connected to D of FF 131, Q of which is connected, through an inverter 159, to the remaining inputs of OR's 161 and 173 and AND's 147, 149 and 183. The output of OR 161 is coupled to a first input each of a Write AND 165 and an Erase AND 167. An 8 Hz pulse output from counter 139 is supplied to the last input of Erase AND 167 and, through an inverter 163, to the last input of Write AND 165. The output of AND 167 is coupled to decoder 69 directly whereas the output of AND 165 is coupled to decoder 69 and memory controls 20 and 22 through a delay circuit 169.

Decoder 69 also produces the UHF sense signal when a UHF channel tuning position is accessed. The UHF sense terminal is connected to one input each of a pair of AND's 155 and 157, a first input of a "0" detector 181 and, through an inverter 171, to a first input of a "1"

detector 179. AND's 155 and 157 have their remaining inputs connected to the respective up/down carryover outputs of fine tuning presettable counter 30 and their outputs connected to corresponding input terminals of coarse tuning presettable counter 28. The output of "0" detector 181 supplies the last input of Down enable NAND 177. Similarly the output of "1" detector 179 supplies the last input of Up enable NAND 175. The plurality of inputs of detectors 179 and 181 are supplied from the respective output of presettable counter 30.

A pair of intermediate registers 190 and 191 are interposed between presettable counters 28 and 30 and comparators 34 and 36 respectively. The output of AND 183 controls operation of these registers which appear "transparent" for VHF tuning positions.

AND 151 has its last input connected to $\overline{Q}$ of FF 131 and its output is connected to an input of an Up clock OR 153, the other input of which is connected to the output of UHF clock AND 149. The output of OR 153 provides the Up clock signal for presettable counter 30.

Circuit Operation

The MNOS type memories have a useful life which is a function of "active" time, that is the duration of the read, write and erase cycles. To lengthen their circuit life these cycles are kept very short. To this end multivibrators 105 and 106 of the "one shot" type, are provided for developing very short duration actuation pulses. AND 109 passes the read pulse to the various memories. Multivibrator 106 is triggered by operation of on-off switch 97 to develop a read pulse when the receiver is initially energized. Thus memory information (corresponding to the accessed column of memory) is initially read into the system to produce a picture. Otherwise the receiver would produce a random display when initially energized.

Memory controls 20 and 22 include bidirectional sense amplifiers operable during both the read and write cycles. Since the equalization memory is a ROM and not viewer-alterable, memory control 24, coupled thereto, need not be bidirectional.

VHF fine tuning is initiated by operation of fine tuning switch 98 in either the up or down direction. Presettable counter 30 is enabled to count, i.e. change, and presettable counter 28 is disabled. In the illustrated embodiment, presettable counter 30 includes an eight bit up/down counter and presettable counter 28 includes a six bit up/down counter. The viewer is in the counter feedback loop—that is he depresses the fine tuning switch and watches the receiver display until tuning is to his satisfaction. While the new or updated fine tuning information is stored in presettable counter 30, it is not entered into the appropriate memory column of fine tuning memory 14 until the fine tuning switch is released. The sequency is as follows. OR 161 is operated by operation of any of FF's 121, 123 or 131. Therefore, upon release of switch 98, either Down FF 121 or Up FF 123 changes state, operating OR 161 which enables Erase AND 167 and Write AND 165. The clock pulse from counter 139 triggers Erase AND 167 which produces an erase pulse for erasing the accessed column of memory. The write pulse from Write AND 165 is delayed by delay circuit 169 and operates memory controls 20 and 22 to transfer the updated fine tuning information into the accessed column of memory. The erase and write gates are also of the "one shot" type to reduce active memory time.

The VHF channel coarse tuning information is contained in a non-alterable ROM. NAND 175, in conjunction with "1" decoder 179, inhibits presettable counter 30 from cycling, i.e., counting beyond its maximum count, when the VHF tuning mode. Similarly, "0" decoder 181, in conjunction with NAND 177, prevents presettable counter 30 from cycling in the other direction, i.e. counting beyond its minimum count. The effect is to stop tuning voltage change when the counters have reached their limits.

Without AND's 155 and 157, the system could be tuned (in VHF) to receive a television channel different from the VHF television channel associated with the accessed tuning position. For example, assume a tuning position corresponding to VHF channel 2 is accessed and the viewer tries to fine tune with the fine tuning control. Without AND's 155 and 157 for disabling presettable counter 28, the receiver could be tuned to receive channel 5, for example. In this tuning position the column of memory accessed in fine tuning memory 14 is adjustable and the information in presettable counter 30 would be stored upon release of the switch, as is normal. However, since the column of memory accessed in VHF coarse tuning memory 10 is not adjustable, information present in presettable counter 28 cannot be stored and would be lost. Consequently, viewer confusion would result upon a later return to that tuning position. AND's 155 and 157 prevent such an occurrence.

Tuning switch 95 is used to coarse tune UHF channels only. For UHF coarse tuning presettable counter 28 is coupled in tandem with presettable counter 30 to form a 14 bit counter. An external high speed clock source is used with this configuration to speed up counting which at "regular" speed would take a very long time. The clock source is indicated as VCO 135. Presettable counters 30 and 28 are connected in tandem in response to the UHF sense signal from decoder 69 which energizes AND's 155 and 157, thus enabling presettable counter 28, which is clocked by presettable counter 30. The UHF sense signal also disables "0" decoder 181 and "1" decoder 179, since presettable counter 30 must be able to cycle for UHF coarse tuning. When tuning switch 95 is activated, a predetermined duration sampling window is generated, during which a viewer-controllable number of VCO oscillations are produced, resulting in very rapid counting or stepping of the presettable counters. The UHF counting speed is about 300 KHz, whereas the VHF counting speed is only 16 Hz. The 16 Hz rate, it will be recalled, enables fine tuning control by visual feedback. The comparator sampling rate is 2 KHz, which would produce effective visual feedback when tuning UHF.

To overcome this, the circuit generates 16 Hz sampling windows, during which high frequency counting "bursts" are generated. These bursts are only "looked at" by the comparators at the end of the window and at a 2 KHz rate and the counters are reset before the next counting window in preparation for receipt of another group of VCO pulses. Since the counters are reset to zero at the end of each counting window, there is no need to count in the down direction and the circuit has no provision for this. "Counting down" is accomplished by loading in fewer pulses in the next sampling interval. Since the sampling windows occur at a 16 Hz rate and the information is presented to the viewer at this rate, visual feedback is effectuated. Many different forms of viewer control may be used for the VCO.

Registers 190 and 191 store the information or count for each counting window and present the information to the comparators for interrogation. When desired tuning has been achieved, tuning switch 95 is released, and the information in presettable counters 28 and 30 is stored in the corresponding memories. Fine tuning occurs in the same manner and at the same speed for UHF and VHF.

EXCLUSIVE OR 111 serves to preclude the possibility of any simultaneous inputs from the up and down terminals of switch 98. The only time either of AND's 113 and 115 is enabled is when both inputs to EXCLUSIVE OR 111 are different.

OR 127 senses activation of either switch 98 or switch 95 and operatess timing FF 133 to enable Down FF 121, Up FF 123 and Tune FF 131. In response to actuation of any of the latter three FF's, the corresponding function is enabled as well as the erase and write circuitry previously described, in preparation for memory contents changes.

During UHF tuning, high speed counting is obtained from VCO 135 through AND 149 and OR 153. The window is established by interaction of the 64 Hz pulse train and 16 Hz pulse train with the outputs of FF 131 and AND's 147, 149 and 151.

Channel addressing is accomplished with a 5 bit comparator 67 and a 5 bit storage register 68 which are simultaneously supplied with a coded input over a plurality of leads 62–66, which also supply decoder 69. The outputs of storage register 68 are connected to the other inputs of comparator 67. The arrangement of storage register and comparator provides an initiation signal for the tuning system whenever the information in the comparator does not match the information in the storage register (which occurs when a channel tuning position change is made). The output of comparator 67 feeds the D terminal of FF 101. Storage register 68 and FF 101 are clocked with a 32 Hz pulse signal. Since the 32 Hz pulse signal is also supplied to the input of AND 103, as is the $\bar{Q}$ output of FF 101, FF 101 introduces a half cycle delay between the time of channel input change and read pulse generation. When a new channel tuning position is selected, a change occurs in the decoder input to the comparator before it occurs at the register input, and the output of comparator 67 sets FF 101 such that at the next 32 Hz pulse, AND 103 is energized to trigger a read pulse which is passed by AND 109.

Figure 3:
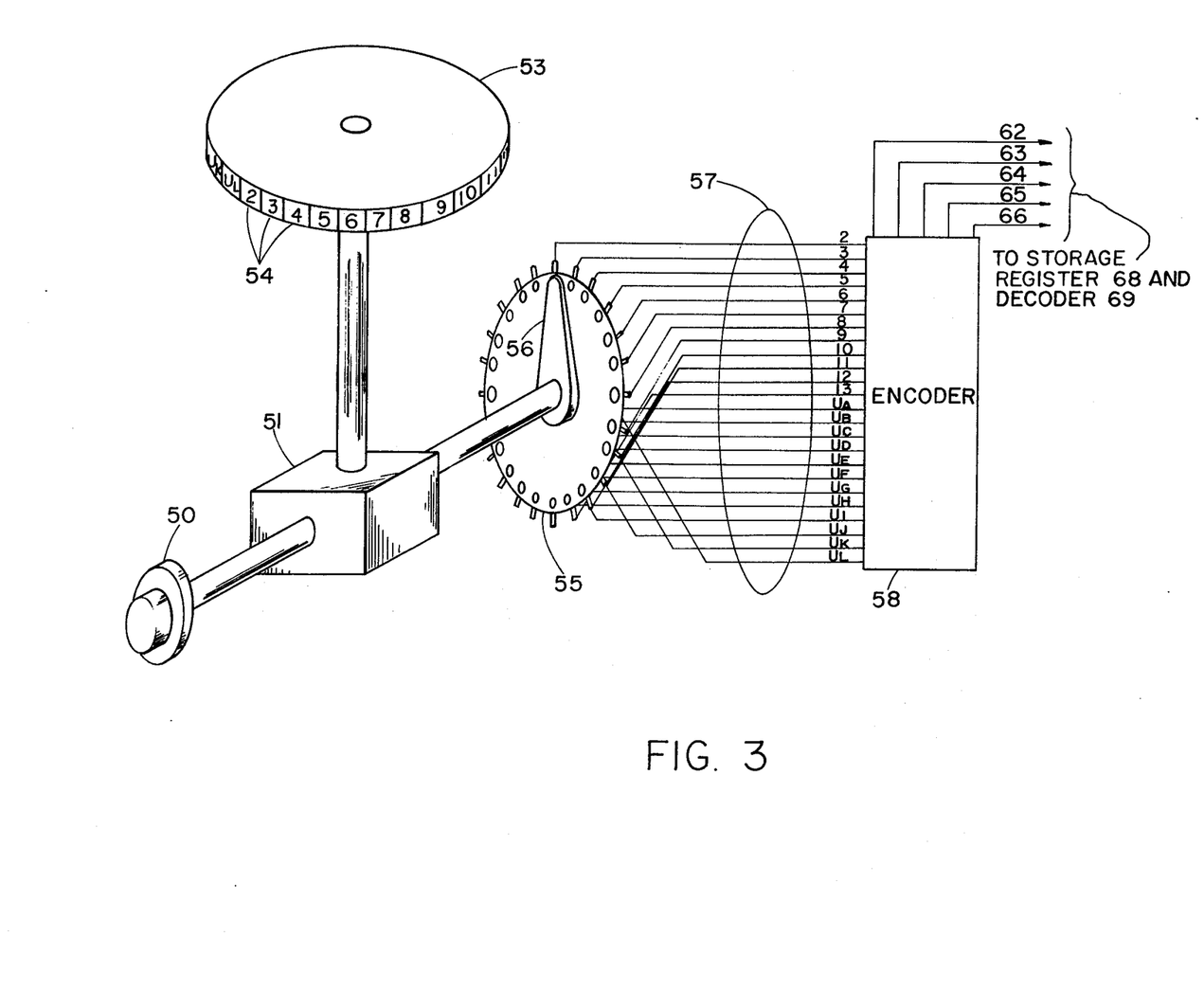
FIG. 3 is one form of channel tuning position address means useful with the arrangement of FIGS. 2A and 2B.

The apparatus depicted in FIG. 3 is used to mechanically access the individual tuning positions. A channel selector knob 50 is coupled to any conventional shaft and gear arrangement 51 (not shown) for simultaneously rotating an indicating wheel 53 and the rotor 56 of a selector switch 55. Rotor 56 of the selector switch carries a contact (not shown) for sequentially completing circuits to a plurality of leads 57 supplied to an encoder 58, indicated in block form. The output of encoder 58 consists of five leads 62–66 which are supplied to register 68 and decoder 69 of FIG. 2A.

It will be appreciated that selector switch 55 includes a contact terminal and output lead for each receiver tuning position. In the 24-position system disclosed the switch has 24 output leads 57, each coupled to encoder 58, and produces a unique binary coded output for each tuning position. Rotatable indicating wheel 53 is appropriately indexed to correspond to movement of channel selector 50 and rotor 56. The indicating wheel includes replaceable tabs 54, each bearing a distinctive channel number designation. As shown, all 12 VHF channel numbers 2–13 are sequentially arranged as well as 12 UHF channel numbers, generally designated by U and a letter subscript. (In the figure, UHF tabs $U_K$ and $U_L$ are visible). It will be readily apparent that other techniques for tuning position selection may be used with equal facility. For example, a remote control device may readily be substituted for the channel selector to produce sequential operation of switch 55 responsive to transmission and reception of appropriate command signals.

Figure 4:
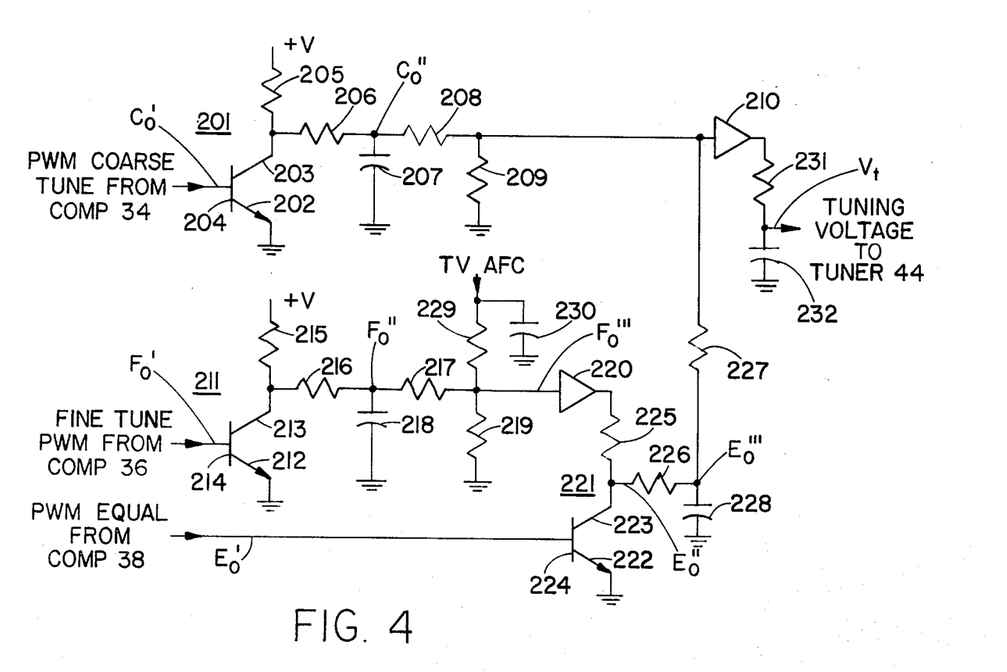
FIG. 4 is a schematic diagram of the hybrid scaling circuit of FIGS. 1 and 2.

The hybrid scaling circuit of FIG. 4 includes three transistors and a pair of Op Amps. Transistor 201 has a grounded emitter electrode 202, a collector electrode 203 connected to a source of $+V$ voltage through a resistor 205, and a base electrode 204 supplied with the PWM coarse tuning information $C_o'$ from comparator 34. Collector 203 is connected, through a filtering arrangement comprising resistors 206, 208 and 209 and a capacitor 207, to the input of an Op Amp 210. The $C_o'$ PWM signal is amplified by transistor 201 and filtered by the low pass filter comprising resistor 206 and capacitor 207.

Transistor 211 includes a grounded emitter electrode 212, a collector electrode 213 connected to $+V$ through a resistor 215, and a base electrode 214 supplied with the PWM fine tuning information $F_o'$ from comparator 36. The output of its collector is filtered through a low pass filter arrangement comprising resistor 216 and capacitor 218 to produce the $F_o''$ signal which is supplied to the input of an Op Amp 220 through a resistor 217. The television AFC signal is coupled to the junction of a grounded capacitor 230 and a resistor 229, the other terminal of which is connected to the input of Op Amp 220. A resistor 219 connects the input of Op Amp 220 to ground.

Transistor 221 includes a grounded emitter electrode 222, a collector electrode 223, connected to the output of Op Amp 220 through a resistor 225, and a base electrode 224 which is supplied with the PWM equalization information $E_o'$ from comparator 38. The output signal $E_o''$ at collector 223 comprises the $F_o''$ signal, "chopped" or sampled by the $E_o'$ signal. The $E_o''$ is filtered by a low pass filter comprising resistor 226 and capacitor 228, thus forming the $E_o'''$ signal. $E_o'''$ is coupled through a resistor 227 to the input of Op Amp 210. Finally, the output of Op Amp 210 supplies a series connection of a resistor 231 and a grounded capacitor 232, the junction of which supplies the DC tuning voltage for the tuner.

To repeat, the PWM signals $C_o'$, $F_o'$ from comparators 34 and 36 are amplified and filtered to develop corresponding DC potentials. The filtered fine tune PWM signal $F_o''$ is added to the television AFC analog signal to form $F_o'''$ and applied to Op Amp 220, the output of which provides the operating potential for equalization transistor 221. Thus the fine tuning information and the AFC information ($F_o'''$ signal) are modified by the equalization information ($E_o'$ signal) and, after further filtering form $E_o'''$ which is applied to Op Amp 210 along with the analog coarse tuning information ($C_o'$ signal). Thus the tuning voltage is developed for the tuner and consists of the coarse tuning information and the equalized fine tuning and AFC information.

Figure 5:
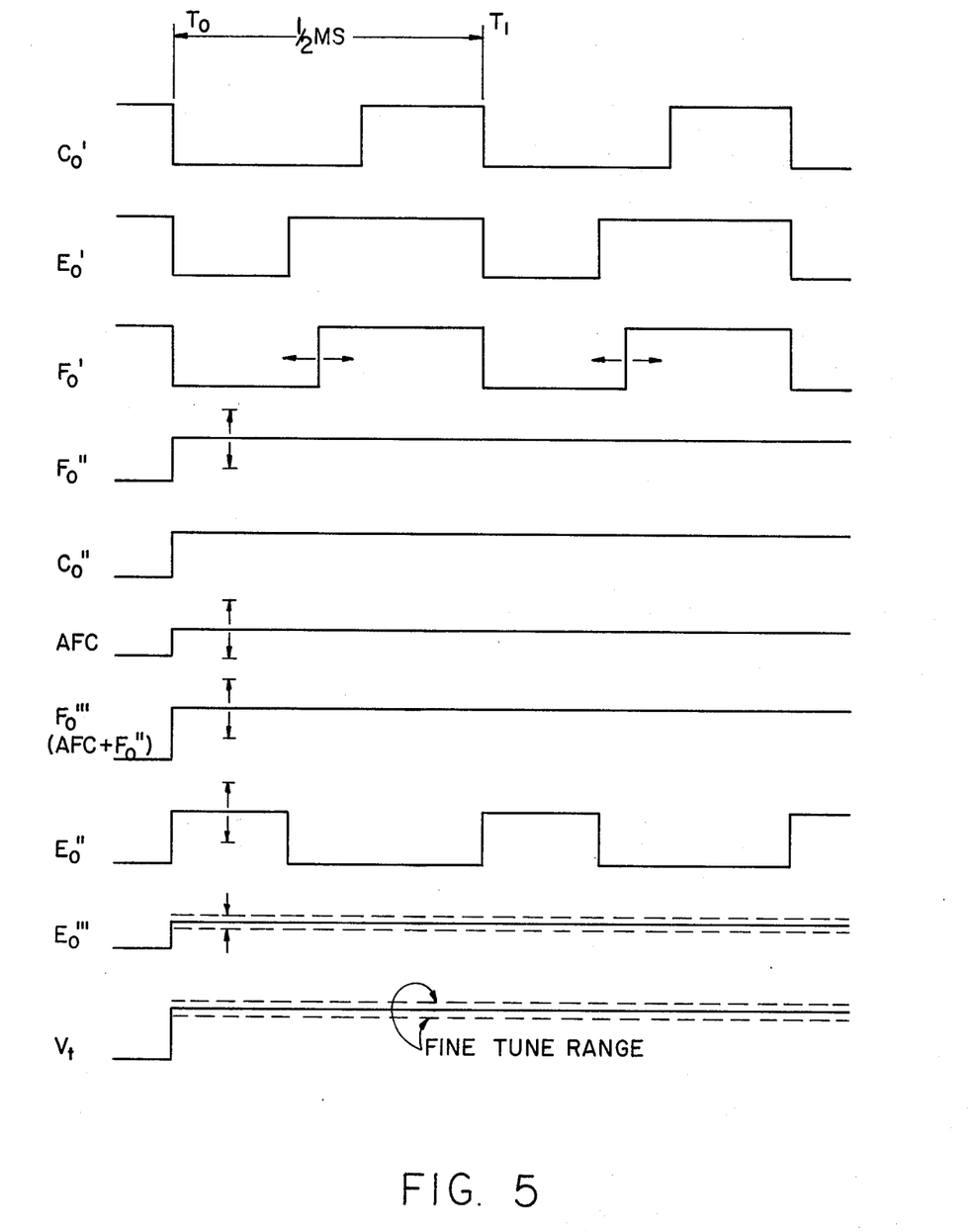
FIG. 5 represents waveforms at various points in the hybrid scaling circuit of FIG. 4.

Reference to FIG. 5 will help clarify circuit operation. The curves are waveforms of representative signals at indicated points in the circuit. $C_o'$ is a negative-going pulse of fixed amplitude. For the assumed condition, it extends for the major portion of the $T_o$–$T_1$ time cycle (approximately one/half millisecond in duration). $E_o'$ is a negative-going pulse of similar amplitude but (for the assumed condition) of more limited duration. Similarly, $F_o'$ has a fixed amplitude but a variable duration, as indicated by the oppositely-directed horizontal arrows. For any given channel, $C_o'$ and $E_o'$ are fixed quantities corresponding to coarse tuning and equalization information stored in the respective memories 10 or 12 and 16. The duration of $F_o'$ is determined by the fine tuning information stored in memory 14, $F_o''$ and $C_o''$ curves are believed self-explanatory and are DC voltages (corresponding to the filtered $F_o'$ and $C_o'$ signals) of an amplitude dictated by the respective duty cycles. The small vertical arrows indicate the range of signal variation. The AFC is a DC signal related to tuning of the receiver. $F_o'''$ is the combination of $F_o''$ and AFC. $E_o''$ results from "chopping" or sampling $F_o'''$ with $E_o'$. $E_o'''$ is the result of filtering $E_o''$ and $V_t$ is the tuning voltage. The dashed lines indicate the voltage range of $E_o'''$ and $V_t$.

The result is a fully equalized tuning system with equal tuning "feel" and equalized AFC action. While a system is feasible in which each tuner tuning characteristic is matched with its individually programmed memory, as a practical matter substantial simplification is possible by using abrupt junction varactor diodes for the VHF coarse tune memory. As will be seen from U.S. Pat. No. 3,962,643 issued June 8, 1976 to John Ma, entitled "Abrupt Junction Varactor Diode Television Tuner" and assigned to Zenith Radio Corporation, tuners with abrupt junction varactor diodes have predictable tuning characteristics. Hence a common memory will suffice for all VHF tuners. So too, the equalization memory may be fixed for the tuners.

For UHF channels, current practice is to use hyper abrupt junction varactor diodes and consequently all UHF memory is of the customer-alterable type. A common UHF equalization factor may be used in this arrangement.

Figure 6:
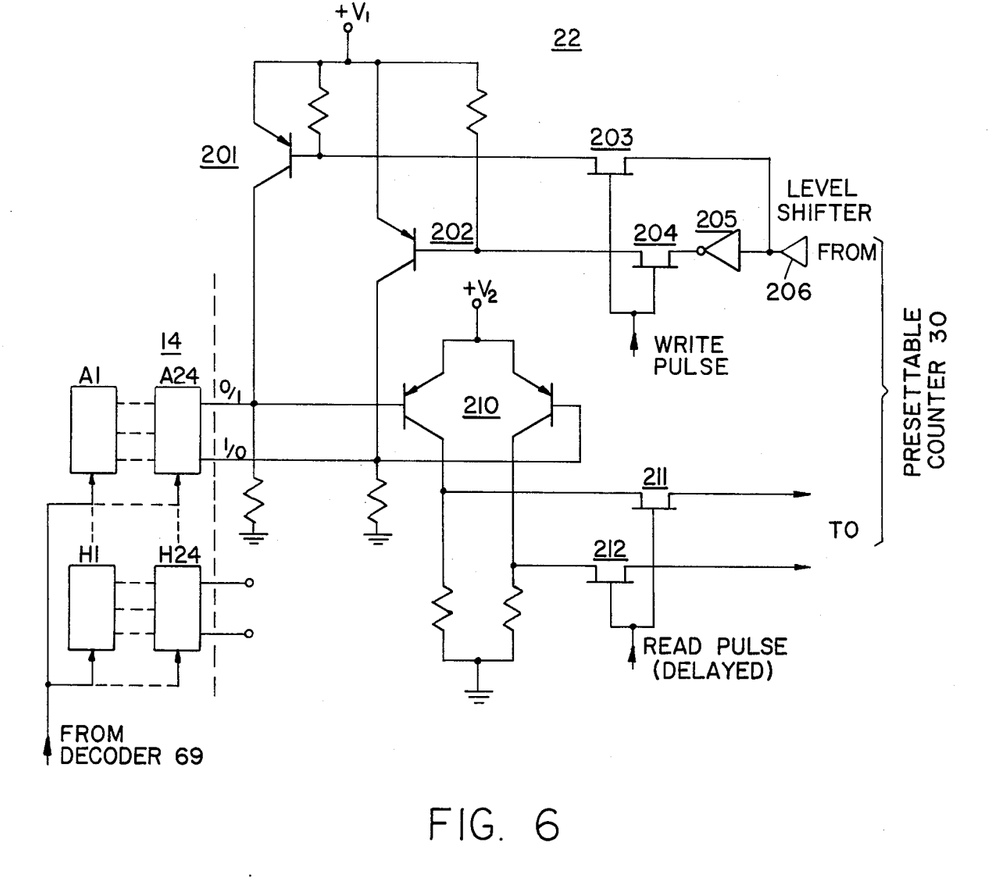
FIG. 6 is a schematic diagram of a simplified form of memory control which may be used in the circuit of FIG. 2.

FIG. 6 is a schematic representation of a portion of memory control 22. It will be appreciated by those skilled in the art that memory control 20 is substantially identical to memory control 22. Memory control 24 is essentially a gated buffer amplifier between the equalization memory and register and is very well known. A portion of V/U fine tuning memory 14 is graphically shown as memory cells in a "grid" having vertical rows A-H and horizontal rows 1-24. Each memory cell is activated via an individual lead connected to decoder 69. Each memory cell is each horizontal row has two output leads which provide information about its contents. The information is presented in the form of a 0/1 logic combination on the output leads. For example, a (1-0) indicates one logic combination and a (0-1) indicates the other. For simplicity only memory cells A1, H1, A24 and H24 are shown.

Memory control 22 includes a sense amplifier comprising a pair of transistor amplifier-drivers 201, 202 and a pair of FET switches 203, 204 for writing information into memory 14. Reading information out of memory and into the presettable counter is accomplished by a differential amplifier 210 and a pair of FET switches 211, 212. (Presettable counter 30 is indicated but not shown).

The write function will be analyzed first. It will be recalled that the presettable counters are adjusted until tuning of the television receiver is to the viewer's satisfaction. When the tuning switch is released a write pulse is generated. (Prior to generation of the write pulse, an erase pulse is produced for erasing any information in the memory cells accessed by decoder 69.) The write pulse activates FET switches 203 and 204 to enable the information from presettable counter 30 (and for UHF, presettable counter 28) to be transmitted therethrough. Inverter 205 generates a logic level pulse of opposite sense to the one from the presettable counter. Thus, a "1" supplied from the presettable counter is transmitted through FET 203 and a "0" is transmitted through FET 204 via inverter 205 and a level shifter 206. These signals are amplified by transistor amplifier-drivers 201 and 202 to set the appropriate memory cell in the memory.

During the read cycle the information contained in the accessed memory cell is supplied to differential amplifier 210 which senses the high and low levels on the memory output leads. A delayed read pulse turns on FET switches 211 and 212 which transmit the appropriate logic levels from the differential amplifier to the presettable counter. The use of both a "0" and a "1" input to the presettable counter simplifies its input circuitry because it is not necessary to detect a signal threshold, but merely toggle a flip-flop. Thus information is take from the memory and applied to the presettable counter to force its count. Each horizontal row of memory requires a separate sense amplifier and each sense amplifier is thus dedicated to a single information bit. This arrangement, while more costly, enables a substantial reduction in tuning time since the information from the memories is read out all-at-once rather than serially. The memory has 24 cells individually accessible by the decoder for supplying each information bit.

Most of the individual components of the above-described tuning system are readily available as off-the-shelf items from a variety of sources and have therefore not been disclosed in great detail. The following is a list of such components

| Device Type No. | Reference |
| --- | --- |
| CD 4002 | 67 |
| CD 4013 | 68, 101, 121, 123, 131, 133 |
| CD 4030 | 34, 36, 38 |
| CD 4048 | 34, 36, 38 |
| CD 4042 | 24, 32 |
| CD 4047 | 105, 106, 165, 167 |
| CD 4516 | 28, 30 |
| CD 4520 | 40, 139 |
| ER 2050 | 10, 12, 14, 20, 22 |

CD devices available from RCA Corp. ER devices available from General Instrument Corp.

What has been described is a novel, limited-position television tuning system for developing tuning voltages for selected channels. Memories store coarse tuning information, fine tuning information and equalization information. The fine tuning information is combined with automatic frequency control information from the television receiver and both informations are proportioned by the equalization information in a hybrid scaling circuit. It will be appreciated that numerous modifications and changes may be made in the described embodiment of the invention without departing from its true spirit and scope as defined in the claims.

What is claimed is:

1. A television receiver including:
    a voltage controllable tuner;

means producing coarse tuning information for a selected group of channels;

means for producing fine tuning information for said selected group of channels;

means producing equalization information, related to the slope of the tuner voltage-versus-frequency characteristic at said selected channels;

means developing AFC information related to the actual tuning condition of said receiver compared with a reference tuning condition;

means proportioning said fine tuning information and said AFC information with said equalization information;

means combining said proportioned fine tuning information and said proportioned AFC information with said coarse tuning information for the selected channel; and means generating a tuning voltage therefrom for said tuner.

2. The television receiver as set forth in claim 1, including memory means for storing said coarse, fine tuning, and equalization information;

means utilizing the stored informations for developing corresponding PWM signals; and means for applying said PWM signals to said means generating said tuning voltage.

3. The television receiver as set forth in claim 2, wherein the combining means include a hybrid arrangement of operational amplifiers and transistors for processing said PWM signals.

4. The television receiver as set forth in claim 3, wherein said hybrid arrangement comprises first and second operational amplifiers and first, second and third transistors, each having an input and an output;

said PWM signals being supplied to respective inputs of said transistors;

the output of said first transistor being supplied to the input of said first operational amplifier;

the output of said second transistor being supplied to the input of said second operational amplifier;

the output of said first operational amplifier providing operating potential for said third transistor, the output of which is coupled to the input of said second operational amplifier; and said AFC information being supplied to the input of said first operational amplifier.

5. A limited-channel television receiver including;

a voltage controllable tuner;

first fixed memory means producing coarse tuning information corresponding to a selected group of channels;

adjustable memory means producing fine tuning information corresponding to said selected group of channels;

second fixed memory means producing equalization information, related to the slope of the tuning voltage-versus-frequency characteristic of said tuner at frequencies corresponding to the channel numbers of said selected channels;

means developing AFC information related to the actual tuning condition of said receiver compared with a reference tuning condition;

means accessing and interrogating said memories for a selected channel to read out the corresponding informations therein;

means proportioning both said fine tuning information and said AFC information with said equalization information;

means combining said proportioned fine tuning information and said proportioned AFC information with said coarse tuning information for the selected channel; and means generating a tuning voltage therefrom for said tuner.

6. A limited-channel television receiver as set forth in claim 5, wherein said first and second fixed memory means are ROMS and said adjustable memory means is an EAROM;

viewer-controllable counter means for adjusting the information in said EAROM; and means communicating results of said adjustments to the viewer.

7. A limited-channel television receiver as set forth in claim 6, wherein said informations are read out as PWM signals and wherein said combining means includes a hybrid scaling circuit having a pair of Op Amps and three transistor choppers.

8. A limited-channel television receiver as set forth in claim 7, wherein said selected group of channels are VHF channels;

said receiver including a plurality of tuning positions at a first group of which said VHF channels are receivable and at a second group of which said UHF channels are receivable; and means under control of said viewer sequentially accessing said tuning positions.

9. A limited-channel television receiver as set forth in claim 8, wherein the contents of said first ROM memory means is coarse tuning information for said VHF channels, the contents of said second ROM memory means comprise equalization information for said VHF channels and the contents of said EAROM memory means comprise coarse tuning information for said UHF channels and fine tuning information for both said UHF and said VHF channels.

10. A limited-channel television receiver as set forth in claim 9, wherein each tuning position in said first group is dedicated to a different VHF channel and each tuning position in said second group is capable of being viewer-programmed to receive any UHF channel.

* * * * *